United States Patent [19]

Payne

[11] Patent Number: 4,727,270
[45] Date of Patent: Feb. 23, 1988

[54] NOISE IMMUNE CIRCUIT FOR USE WITH FREQUENCY SENSOR

[75] Inventor: Paul E. Payne, Ft. Lauderdale, Fla.

[73] Assignee: North American Philips Corporation, New York, N.Y.

[21] Appl. No.: 861,040

[22] Filed: May 8, 1986

[51] Int. Cl.⁴ .......................... H03B 1/04; H03K 5/08
[52] U.S. Cl. ..................................... 307/540; 307/542; 307/546; 307/520; 328/165
[58] Field of Search .................. 307/540, 542–543, 307/546, 553, 555, 556, 520; 328/165

[56] References Cited
U.S. PATENT DOCUMENTS

| 4,256,975 | 3/1981 | Fukushima et al. | 307/543 |
| 4,333,024 | 6/1982 | Maussion | 307/542 |
| 4,462,008 | 7/1984 | Katakura | 307/542 |
| 4,544,951 | 10/1985 | Yoshisato | 307/540 |

Primary Examiner—Stanley D. Miller
Assistant Examiner—B. P. Davis
Attorney, Agent, or Firm—Jack E. Haken; James J. Cannon, Jr.

[57] ABSTRACT

A noise immune circuit for use with pulse type sensors whereby a noise modulated signal is clipped and shaped in a hard limiter to a square wave signal before being filtered by a low pass filter. A Schmitt trigger with substantial feedback then biases the threshold of said hard limiter for discrimination of noise from signal.

3 Claims, 3 Drawing Figures

NOISE IMMUNE CIRCUIT FOR USE WITH FREQUENCY SENSOR

BACKGROUND OF THE INVENTION

1. Field of the Invention

The invention pertains generally to sensors such as frequency sensors, motion sensors, position sensors and other similar sensors and in particular to noise discrimination circuits for use with said sensors, that is, circuits which are immune from the noise frequently caused by spurious short duration pulses. The elimination of the effects of high energy electromagnetic noise of very short duration with high amplitude is achieved in a frequency sensor.

2. Description of the Prior Art

Pickup circuits for use with various static and dynamic sensors initially receive a noise modulated signal from the sensor device. Prior art pickup circuits then usually filter the noise modulated signal before further processing, using a low pass filter. However these filtered signals are still both voltage dependent and amplitude dependent. Spurious high frequency pulses with high amplitude and of short duration can pass through such a filter. The present invention is directed to a circuit which minimizes the shortcomings of the low pass filter and thereby discriminates the true signal from noise more effectively than heretofore achieved.

SUMMARY OF THE INVENTION

The purpose of the present invention is to provide a noise immune circuit for use with dynamic and static sensors, such as a frequency sensor, a position sensor, a motion sensor, or the like. The noise immune circuit employs electronic techniques which prevent the sensor outputs from erroneously responding to high voltage, short duration noise which may be inputted by the sensor itself, such as that which would arise from a spurious pulse of short duration. In a static frequency sensor employing the noise immune circuit of the present invention, it has been possible to eliminate the effects of high energy electromagnetic noise as sensed by a magnetic resistor. This noise is generally of very short duration but may have very high amplitude. It is a further object of the invention to filter out other noise which may be capacitively coupled through a sensor such as a magnetic resistor or coil pickup.

The noise immune circuit of the present invention passes the noise modulated signal through a hard limiter or comparator which shapes the signal into a square wave, thus clipping both the noise and the signal. The square wave signal is then processed by a low pass filter and a second comparator which functions as a Schmitt trigger. A substantial feedback from the Schmitt trigger introduces a hysteresis for the input to the hard limiter to establish a threshold, thereby latching the first comparator. The real signal thus sets up a bias threshold, such that short duration high energy pulses from the signal, may momentarily cause the first comparator to switch but it will return to the biased condition; or if the short duration pulses cannot overcome the bias, the first comparator does not switch at all.

DESCRIPTION OF THE PREFERRED EMBODIMENT

Figure 1:
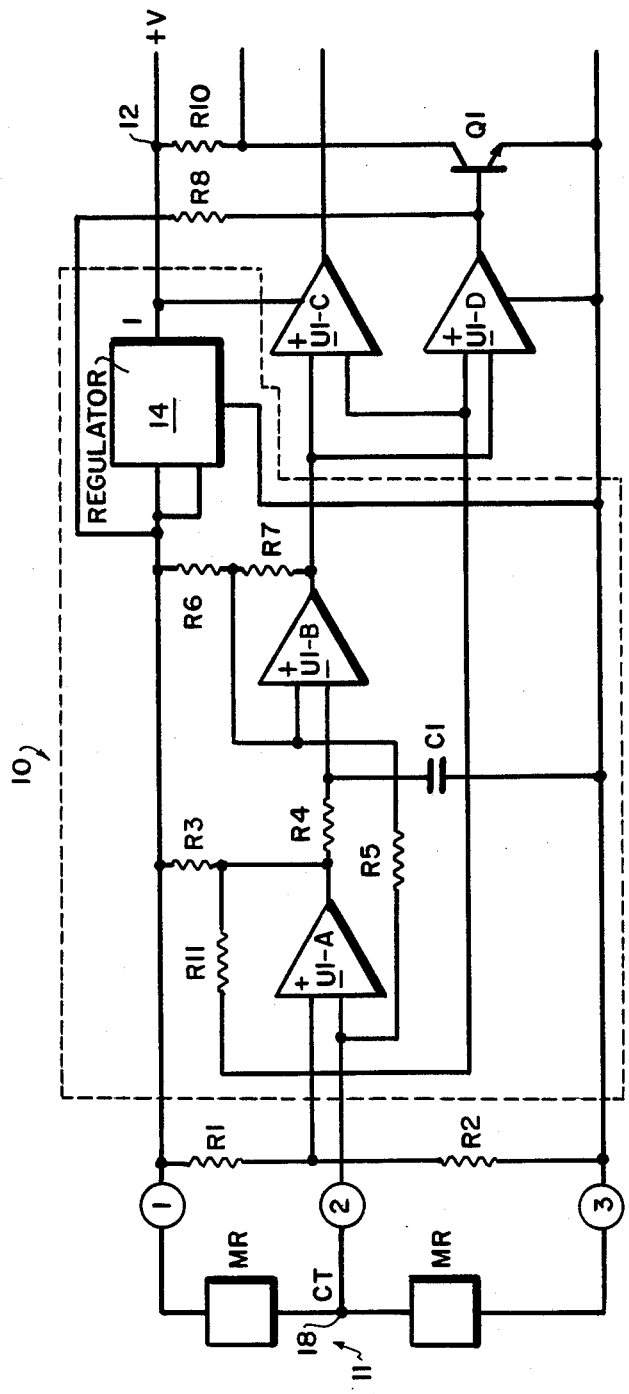
FIG. 1 is a schematic drawing of a frequency sensor for static pickup using the noise immune circuit of the present invention.

The present invention pertains to a noise immune circuit 10 for use with a frequency sensor, pulse sensor, position sensor 11 or other similar sensors. A sensor using such a circuit is illustrated in FIG. 1. The invention will be described with reference to this specific embodiment of a frequency sensor which senses gear teeth of a rotating or static gear. However, it should be understood that the invention is not limited to such a sensor.

Figure 3:
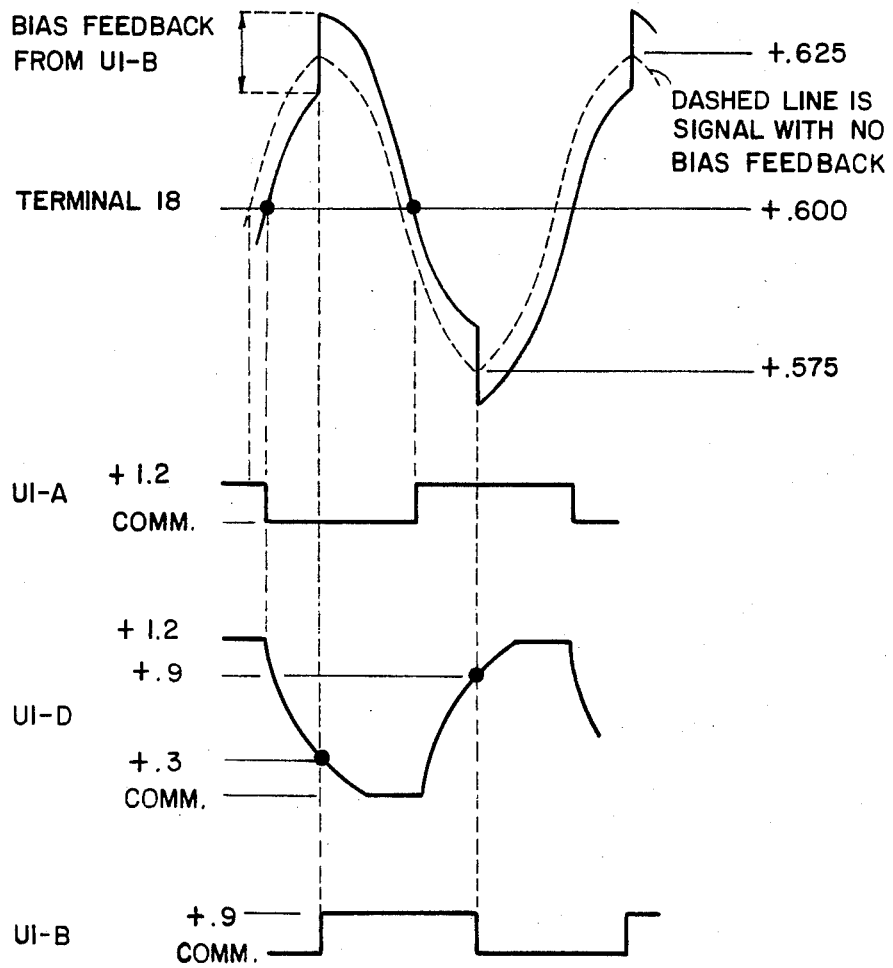
FIG. 3 illustrates the waveforms of the signals being processed at various points in the circuit of FIGS. 1 and 2.

Referring now to FIG. 1, a power input 12 to a voltage regulator 14 establishes a low voltage such as +1.2 VDC at its output which is fed to the noise immune circuit 10 connected to a sensor 11 having a magnetic resistor MR. The magnetic resistor MR is connected to terminals 1, 2 and 3 of the circuit 10 through its center tap 18. The magnetic resistor MR is physically mounted on the face of a permanent magnet (not shown) and is excited by a rotating gear or other ferromagnetic target. The initial static unbalance of the magnetic resistor MR is compensated by trimming either resistor R1 or resistor R2 to set up a balanced input to a first voltage comparator U1-A. Using the embodiment of a gear tooth sensor, as a symmetrical target rotates, this target rotation causes the center tap CT (18) of the magnetic resistor MR to deviate in voltage from the statically balanced input to comparator U1-A. This difference in voltage causes the output of U1-A to produce a square wave whose frequency directly corresponds to the number of teeth of a rotating gear passing the magnetic resistor MR per second. The input signal to U1-A is a noise modulated signal which is then clipped and shaped by the first differential comparator U1-A, which functions as a hard limiter. This is illustrated in FIG. 3 in which the waveform from center tap 18 and the waveform of the output of U1-A are illustrated. The frequency ranges from DC, target stopped, to 30 kHz, the practical limit. Resistor R11 provides a miniscule positive feedback, a hysteresis, which assists voltage comparator U1-A to make transitions on its output without oscillations. The output of U1-A switches between the power rails, that is between +1.2 volts and common in the embodiment illustrated.

The output of U1-A, which is a clipped noise modulated signal shaped to a square wave is then filtered. Resistor R4 and capacitor C1 form a low pass filter to process the square wave signals generated by U1-A. A time constant controls the maximum frequency of the voltage waveform presented to a second voltage comparator U1-B.

U1-B, a second voltage comparator, detects the filtered output of U1-A and sends a substantial positive feedback (one-half the supply voltage) to its own input, thus serving as a functional Schmitt trigger, whose trigger points are fixed by the ratios of resistors R5, R6 and R7 at $+(0.25 \times 1.2 \text{ V})$ and $+(0.75 \times 1.2 \text{ V})$, the hysteresis being $(0.5 \times 1.2 \text{ V})$. The absolute values of resistors R5, R6 and R7 also determine the magnitude of the second positive feedback applied to voltage comparator U1-A which is typically a much stronger component than that supplied by R11. Thus, the second voltage comparator U1-B discriminates the true signal from noise and provides a bias feedback to the first comparator U1-A which serves as a threshold to latch voltage comparator U1-A firmly until a change in the signal appears on its input, thus eliminating low amplitude transient noise. This bias feedback causes the first comparator to return to its biased state after a high energy transient. Typical waveforms are shown in FIG. 3. The balance of the circuit is not relevant to the invention.

Figure 2:
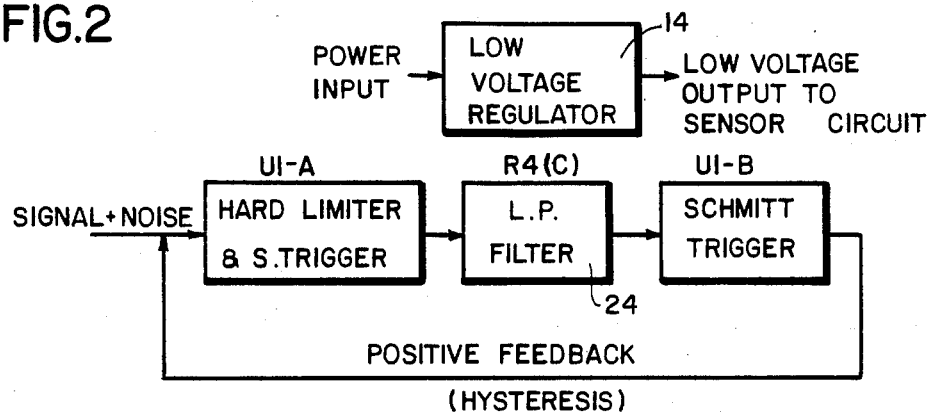
FIG. 2 is a block diagram of the noise immune circuit used in FIG. 1.

The invention is basically illustrated in block diagrams form in FIG. 2 in which a noise modulated signal is processed by comparator U1-A which functions as a hard limiter which clips and shapes its input and has a biased threshold. The output of U1-A is filtered by the low pass filter 24 comprising resistor R4 and capacitor C1 and then is further processed by the comparator U1-B, which is functionally a Schmitt trigger. The positive feedback, hysteresis, from U1-B is then sent back to the input of U1-A.

It can be seen from the waveforms in FIG. 3 that time constant R4-C1 controls the maximum rate of change of the voltage waveform presented to U1-B. It is also obvious that a spurious pulse of short duration, from U1-A would have a small effect on the positive or negative dwell time of the U1-B output, but would not cause an erroneous voltage transition.

By employing this circuit it has been possible to eliminate the effects of high energy electromagnetic noise as sensed by the magnetic resistor. This noise is generally of a very short duration but very high amplitude at the center tap terminal 18. In addition, other noise which is capacitively coupled to the magnetic resistor MR is also filtered out. The electromagnetic noise may be two to three times the useable signal and the capacitive noise may exceed the rail voltages. The use of a fast response, low output impedance voltage regulator 14 is also effective against power supply transients. The additional use of feedback to the input to comparator U1-A is also a contributor to noise immunity.

Thus, the present invention employs electronic techniques which prevent the sensor outputs from erroneously responding to high voltage short duration noise which is picked up by the sensor, by using a hard limiter and a low pass filter with positive feedback, or hysteresis, originating after the filter.

In place of the magnetic resistor the active element may be a variable reluctance element, a coil pickup, a Hall cell, a magnetorestrictive element or any other type of active sensing element which causes a threshold decision.

I claim:

1. A noise immune circuit for use with sensors to discriminate against transient noise pulses which modulate detection signals produced by such sensors, such circuit comprising:
   input means to receive detection signals from at least one sensor;
   a power supply for providing d.c. operating voltage to said circuit;
   a first voltage comparator having a first input receiving said detection signals from said sensor and a second input receiving d.c. voltage from said power supply, said first and second inputs being balanced for a preselected amplitude level of said detection signals;
   said first voltage comparator having an output at which it produces a clipped square wave whose frequency corresponds to the frequency of said detection signals;
   a low pass filter connected to the output of said first voltage comparator to limit the maximum frequency of the square wave output produced thereby;
   a second voltage comparator having first and second inputs and an output, said first input thereof being connected to said filter to receive said frequency limited square wave output of said first voltage comparator, and said second input of said second voltage comparator being connected to said output thereof to receive positive feedback therefrom, so that said second voltage comparator operates as a Schmitt trigger circuit having a hysteresis trigger voltage characteristic at the first input thereof and producing a square wave at said output thereof of the same frequency as the square wave output of said first voltage comparator;
   the output of said second voltage comparator further being fed to said second input of said first voltage comparator as a bias voltage which latches the output of said first voltage comparator until a detection signal received thereby from said sensor exceeds a predetermined threshold amplitude level, thereby eliminating transient noise pulses below such predetermined threshold amplitude level;
   said bias voltage being maintained by said second voltage comparator so as to cause said first voltage comparator to return to its latched state after termination of a transient noise pulse which exceeds said predetermined threshold amplitude level;
   whereby at the output of said second voltage comparator there is produced a square wave of a frequency substantially the same as that of said sensor detection signals, notwithstanding modulation of such signals by noise pulses.

2. The circuit of claim 1, wherein the first input of said first voltage comparator is connected to the output thereof to receive positive feedback therefrom so as to prevent oscillation of said first voltage comparator during transitions of the square wave produced at the output thereof.

3. The circuit of claim 1 or 2, wherein said power supply comprises a voltage regulator for stabilizing the d.c. operating voltage produced thereby so as to maintain a constant value of said balanced amplitude level of said sensor detection signals.

* * * * *